(12) United States Patent
Diamantopoulos et al.

(10) Patent No.: US 11,418,232 B2
(45) Date of Patent: Aug. 16, 2022

(54) WAVEFORM EQUALIZATION DEVICE

(71) Applicant: Nippon Telegraph and Telephone Corporation, Tokyo (JP)

(72) Inventors: Nikolaos-Panteleimon Diamantopoulos, Tokyo (JP); Takaaki Kakitsuka, Tokyo (JP); Shinji Matsuo, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/294,799

(22) PCT Filed: Nov. 6, 2019

(86) PCT No.: PCT/JP2019/043405
§ 371 (c)(1),
(2) Date: May 18, 2021

(87) PCT Pub. No.: WO2020/105430
PCT Pub. Date: May 28, 2020

(65) Prior Publication Data
US 2022/0014231 A1    Jan. 13, 2022

(30) Foreign Application Priority Data

Nov. 20, 2018   (JP) ............................. JP2018-217072

(51) Int. Cl.
*H04B 3/04*        (2006.01)

(52) U.S. Cl.
CPC .................................... *H04B 3/04* (2013.01)

(58) Field of Classification Search
CPC ............. H04B 3/04; H04B 3/14; H04B 3/144
See application file for complete search history.

(56) References Cited

U.S. PATENT DOCUMENTS

| | | | |
|---|---|---|---|
| 6,600,794 B1* | 7/2003 | Agarossi | G11B 20/10009 375/229 |
| 2002/0060827 A1* | 5/2002 | Agazzi | H04B 10/2543 398/158 |

(Continued)

OTHER PUBLICATIONS

Diamantopoulos et al., "On the Complexity Reduction of the Second-Order Volterra Nonlinear Equalizer for IM/DD Systems," Journal of Lightwave Technology, vol. 37, No. 4, Feb. 15, 2019, pp. 1214-1224.

(Continued)

*Primary Examiner* — David B Lugo
(74) *Attorney, Agent, or Firm* — Slater Matsil, LLP

(57) ABSTRACT

An inference processing apparatus includes an input data storage unit that stores pieces X of input data, a learned NN storage unit that stores a piece W of weight data of a neural network, a batch processing control unit that sets a batch size on the basis of information on the pieces X of input data, a memory control unit that reads out, from the input data storage unit, the pieces X of input data corresponding to the set batch size, and an inference operation unit that batch-processes operation in the neural network using, as input, the pieces X of input data corresponding to the batch size and the piece W of weight data and infers a feature of the pieces X of input data.

8 Claims, 4 Drawing Sheets

(56) References Cited

U.S. PATENT DOCUMENTS

2016/0212003 A1* 7/2016 Chen .................. H04B 10/6971
2018/0269988 A1* 9/2018 Yu ....................... H04L 27/2627

OTHER PUBLICATIONS

Kaneda, et al., "Nonlinear Equalizer for 112/GB/s SSB-PAM4 in 80-km Dispersion Uncompensated Link," Optical Society of America (OFC), 2017, 3 pages.

Tsimbinos et al., "Computational complexity of Volterra based nonlinear compensators," Electronics Letters, vol. 32, No. 9, Apr. 25, 1996, pp. 852-854.

* cited by examiner

WAVEFORM EQUALIZATION DEVICE

CROSS-REFERENCE TO RELATED APPLICATIONS

This application is a national phase entry of PCT Application No. PCT/JP2019/043405, filed on Nov. 6, 2019, which claims priority to Japanese Application No. 2018-217072, filed on Nov. 20, 2018, which applications are hereby incorporated herein by reference.

TECHNICAL FIELD

The present invention relates to a waveform equalization device, and more particularly relates to a waveform equalization device for eliminating waveform distortion of an optical signal due to nonlinearity of an optical fiber or the like.

BACKGROUND

Internet traffic in data centers and access networks is expected to grow, and practical application of 400 Gb Ethernet (registered trademark) using the wavelength multiplexing technology and direct detection (DD: Direct Detection) is underway. Conventionally, in increasing the capacity of the core network, phase modulation and coherent reception have been used as multi-value conversion means. On the other hand, in short-distance communication, from a viewpoint of reduction in cost, an intensity modulation and multi-value conversion technology using pulse amplitude modulation (PAM: Pulse-Amplitude Modulation), and a discrete multitone (DMP: Discrete Multitone modulation) technology attract attention.

In these intensity modulation (IM: Intensity Modulation)/direct detection (DD) systems, various problems occur due to dispersion and nonlinearity of optical fibers. Of these problems, a problem of waveform distortion of a propagating optical signal that is caused by nonlinearity of an optical fiber can be solved by performing waveform shaping (waveform equalization) of a signal after photoelectric conversion. The waveform shaping technology includes a digital nonlinear equalization (NLE: Nonlinear Equalization) technology.

CITATION LIST

Non-Patent Literature

Non-Patent Literature 1: J. Tsimbinos and K. V. Lever, "Computational complexity of Volterra based nonlinear compensators", Electronics Letters, vol. 32, no. 9, pp. 852-854, 1996.
Non-Patent Literature 2: N. Kaneda, et al., "Nonlinear Equalizer for 112-Gb/s SSB-PAM4 in 80-km Dispersion Uncompensated Link", Optical Society of America, Optical Fiber Communications Conference and Exhibition, pp. 19-23, 2017.

SUMMARY

Technical Problem

As nonlinear equalization processing by digital signal processing (DSP: Digital Signal Processing), the Volterra series is used (Non-Patent Literature 1). An equalization technology based on the Volterra series (VNLE: Volterra-based Nonlinear Equalization) is effective in many cases, but has a problem in real-time processing because the amount of computational processing increases.

When an input signal to a waveform equalization device is x in the equalization processing using a conventional K-th order Volterra series, an $m^{th}$ output $y(m)$ is expressed by the following formula with a memory length in the k-th order as $L_k$.

Formula 1

$$y(m) = \sum_{k=1}^{K} \sum_{n_1=0}^{L_k-1} \sum_{n_2=0}^{n_1} \cdots \sum_{n_k=0}^{n_{k-1}} \{w_k(n_1, n_2, \ldots, n_k) \cdot x(m-n_1)x(m-n_2)\ldots x(m-n_k)\} \quad (1)$$

In formula (1), $w_k(n_1, n_2, \ldots n_k)$ is a weight of a tap (TAP) of a k-th order for equalization processing. Further, the memory length $L_k$ is a memory length of k-th order, and is a storage length of input signal data x necessary for performing waveform equalization correction. Computational Complexity (CC) (Computational Complexity) in formula (1) is expressed by the following formula.

Formula 2

$$CC_{VNLE}(K, L) = \sum_{k=1}^{K} \frac{(L_k - 1 + k)!}{(k-1)!(L_k - 1)!} \quad (2)$$

A relationship among the memory length $L_k$, an order K of a series according to formula (2), and computational complexity is shown in FIG. 7. With increase in $L_k$ and K, a value of CC abruptly increases, and computation is complicated. Accordingly, the order K=2 is practically used, but computational complexity still remains high. In the case of K=2, formula (1) is expressed as follows.

Formula 3

$$y(m) = \underbrace{\sum_{n_1=0}^{L_1-1} w_1(n_1)x(m-n_1)}_{LE} + \underbrace{\sum_{n_1=0}^{L_2-1} \sum_{n_2=0}^{n_1} w_2(n_1, n_2)x(m-n_1)x(m-n_2)}_{NLE} \quad (3)$$

In formula (3), a first term is a linear term, and a second term is a nonlinear term. Computational complexity in formula (3) is expressed by "$CC_{VNLE,2}(L_1, L_2)=L_1+L_2(L_2+1)$ . . . (4)", and a total number of taps is expressed by the following formula.

Formula 4

$$N_{VNLE,2}(L_1, L_2) = \sum_{n=1}^{L_1} n^0 + \sum_{n=1}^{L_2} n^1 = L_1 + L_2(L_2+1)/2 \quad (5)$$

In this way, even when the second-order Volterra series is used, computational complexity and the total number of taps include the squared term of the second-order memory length $L_2$, and therefore it is necessary to suppress the memory length $L_2$ practically. Therefore, the method using a simple second-order nonlinear term to simplify processing is reported (Non-Patent Literature 2), but a degree of improvement in the linear equalization processing is small, and an equalization function with higher performance is required.

Embodiments of the present invention are made to solve the problems as above, and has an object to simplify equalization processing of a signal in which nonlinearity exists.

Means for Solving the Problem

A waveform equalization device according to embodiments of the present invention is a waveform equalization device including a computation circuit and a storage device, and obtaining an output signal y that is waveform-equalized by expanding an input signal x in which nonlinearity exists with a second-order Volterra series, and includes a computation processing unit that obtains an $m^{th}$ output signal $y(m)$ by using formula (A) as follows.

Formula 5

$$y(m) = w_1^T \cdot x_{1,m} + \sum_{n=0}^{h-1} w_{2,n}^T \cdot (x_{2,m} \bullet x_{2,m-n}) \quad (A)$$

Here, h is a total number of kernels to consider, $1 \leq h \leq L_2$ is established, and $L_2$ is a second-order memory length.

$x_{2,m}$ is a vector notation of the input signal $x(m)$ of a k-th order to the $m^{th}$ equalized output signal $y(m)$, and $x_{k,m} = [x(m), x(m-1), \ldots, x(m-L_k-1)]^T$ is established.

$w_1$ is a vector notation of a tap weight of a linear term in formula (A), $w_1 = [w(0), w(1), \ldots, w(L_1-1)]^T$ is established and $L_1$ is a first-order memory length.

$w_{2,n}$ is a vector notation of a tap weight of a nonlinear term in formula (A) to an $n^{th}$ kernel, $W_{2,n} = [W_2(n,0), w_2(1+n,1), \ldots, w_2(L_2+n-1, L_2-1))]^T$ is established, and $L_2$ is a second-order memory length.

In one configuration example of the above described waveform equalization device,
a preprocessing unit that performs preprocessing of removing beat interference between input signals is further included.

Effects of Embodiments of the Invention

As described above, according to embodiments the present invention, the waveform-equalized output signal y is obtained by expanding the input signal x with the second-order Volterra series by using formula (A), and therefore an excellent effect of being able to simplify equalization processing of a signal in which nonlinearity exists is obtained.

DETAILED DESCRIPTION OF ILLUSTRATIVE EMBODIMENTS

Hereinafter, a waveform equalization device according to an embodiment of the present invention will be described. The waveform equalization device is a waveform equalization device that obtains an output signal y that is waveform-equalized by expanding an input signal x in which nonlinearity exists with a second-order Volterra series. The waveform equalization device obtains an $m^{th}$ output signal $y(m)$ by using formula (6) as follows.

Formula 6

$$y(m) = w_1^T \cdot x_{1,m} + \sum_{n=0}^{h-1} w_{2,n}^T \cdot (x_{2,m} \bullet x_{2,m-n}) \quad (6)$$

In formula (6), h is a total number of kernels to consider, and is in a range of "$1 \leq h \leq L_2 \ldots$ (7)". In other words, the total number h of kernels has a smaller value than the second-order memory length $L_2$.

Further, in formula (6), $x_{k,m}$ is a vector notation of the input signal $y(m)$ of k-th order to the $m^{th}$ equalized output signal $x(m)$, and is expressed as "$x_{k,m} = [x(m), x(m-1), \ldots, x(m-L_k+1)]^T \ldots$ (8)".

Further, in formula (6), $w_1$ is a tap weight of a linear term (first term), and is expressed as "$w_1 = [w(0), w(1), \ldots, w(L_1+1)]^T \ldots$ (9)" by using a first-order memory length $L_1$ by a vector notation.

Further, in formula (6), $w_{2,n}$ is a vector notation of a tap weight of a nonlinear term (second term) to an $n^{th}$ kernel, and is expressed as "$W_{2,n} = [W_2(n,0), w_2(1+n,1), \ldots, w_2(L_2+n-1, L_2-1))]^T \ldots$ (10)" by using the second-order memory $L_2$.

According to the aforementioned present invention, computational complexity and the total number of taps are expressed by "$CC_{R2-VNLE}(L_1, L_2) = L_1 + L_2(h+1) \ldots$ (11)", and "$N_{R2-VNLE}(L_1, L_2) = L_1 + L_2(h+1)/2 \ldots$ (12)".

Figure 1:
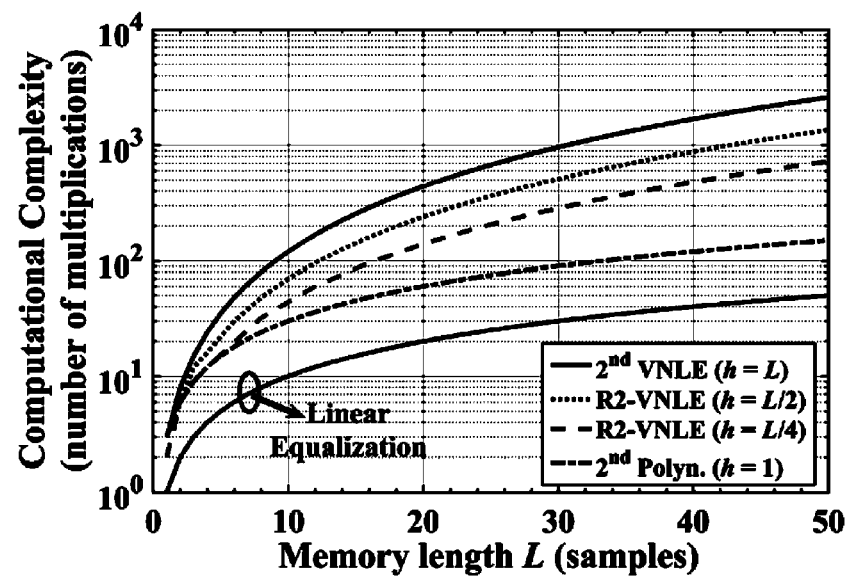
FIG. 1 is an explanatory diagram illustrating a result of comparing values of linear equalization processing in a case of a conventional second-order VNLE based on ordinary formula (3), and in cases of h=1, L/4 and L/2 in embodiments of the present invention.

As is known by comparing formula (4) and formula (11), and formula (5) and formula (12), in the present invention, by setting of the kernel number h, complexity can be greatly improved. FIG. 1 illustrates a result of comparing values of linear equalization processing in a case of conventional second-order VNLE based on ordinary formula (3), and in cases of h=1, L/4 and L/2 in the present invention. FIG. 1 illustrates a relationship of a memory length L and computational complexity.

For example, when the memory length L is 30 or more, improvement in complexity is 70% or more in the case of h=L/4, and is 45% or more in the case of h=L/2. In this way, according to the present invention, the number of computations is greatly reduced. In addition to reduction in complexity, in the present invention, as described later, even when the kernel number h has a smaller value than the memory length L, an equalization function is not lost.

Figure 2A:
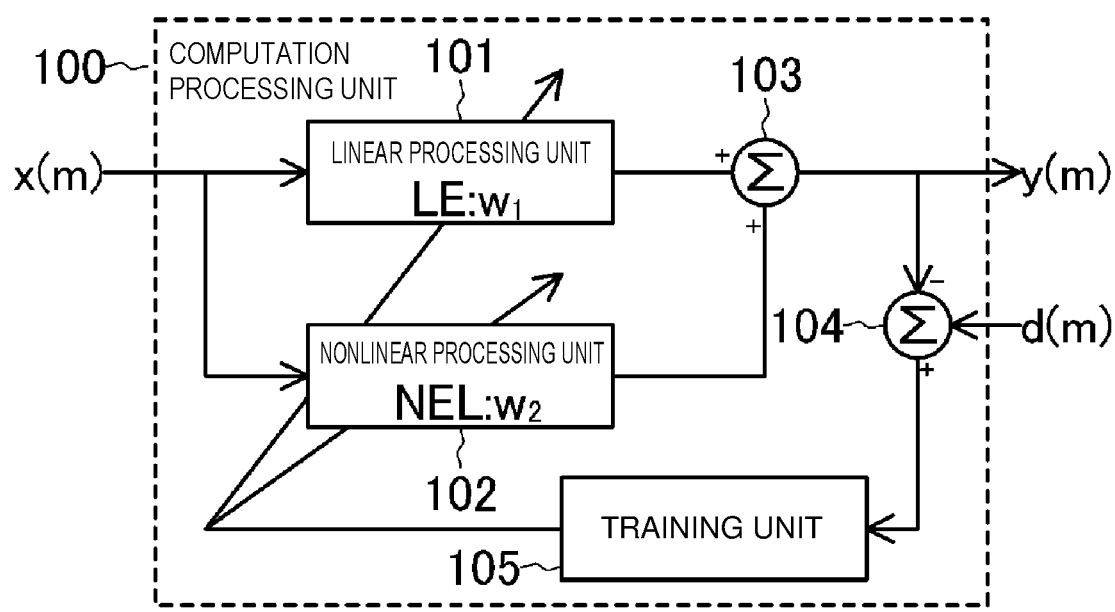
FIG. 2A is a configuration diagram illustrating a configuration example of a waveform equalization device according to embodiments of the present invention.
Figure 2B:
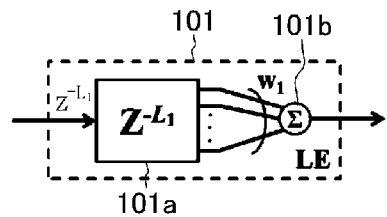
FIG. 2B is a configuration diagram illustrating a configuration example of the waveform equalization device according to embodiments of the present invention.
Figure 2C:
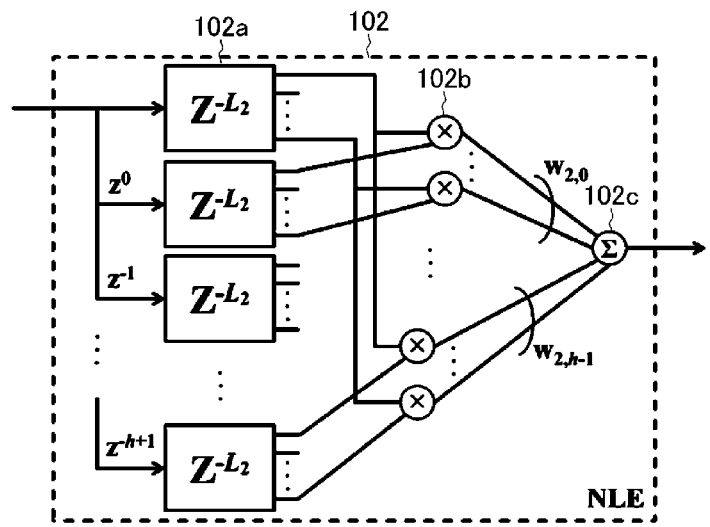
FIG. 2C is a configuration diagram illustrating a configuration example of the waveform equalization device according to embodiments of the present invention.

Next, configuration examples of the waveform equalization device according to the embodiment of the present invention will be described with reference to FIG. 2A, FIG. 2B and FIG. 2C. The waveform equalization device can be configured by a computation processing unit 100 including a linear processing unit 101, a nonlinear processing unit 102, and a summing unit 103. As illustrated in FIG. 2B, the linear processing unit 101 can be configured by a delay processing unit 101a, and a summing unit 101b. Further, as illustrated in FIG. 2C, the nonlinear processing unit 102 can be configured by a plurality of delay processing units iota, integration units 102b, and a summing unit 102c. Note that $z^0, z^{-1}, z^{-2}, \ldots, z^{-t}, \ldots z^{-h+1}$ represent delay processing to a $t^{th}$ kernel. Further, $Z^{-t}$ expresses a vector including delay processing to $0^{th}$ to the $t^{th}$ kernels. Further, LE denotes linear equalization, and NLE denotes nonlinear equalization.

To the $m^{th}$ input signal x(m), processing corresponding to the first term of formula (6) is firstly carried out in the linear processing unit 101. Further, to the $m^{th}$ input signal x(m), processing corresponding to the second term of formula (6) is carried out in the nonlinear processing unit 102. A processing result in the linear processing unit 101 and a processing result in the nonlinear processing unit 102 are summed up in the summing unit 103, and are outputted as the $m^{th}$ output signal y(m). Further, the output signal y(m) is compared with a reference signal d(m) in a comparison unit 104, and a comparison result (error signal) is outputted. Based on the comparison result outputted from the comparison unit 104, a training unit 105 changes a weight in the linear processing unit 101, and a weight in the nonlinear processing unit 102.

Figure 3:
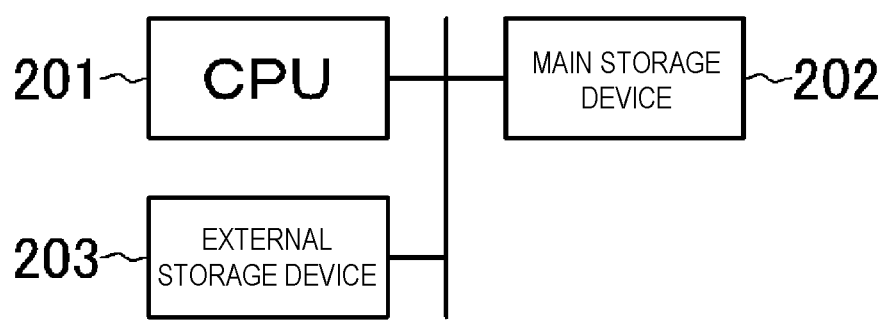
FIG. 3 is a configuration diagram illustrating a hardware configuration of the waveform equalization device according to embodiments of the present invention.

The waveform equalization device including the linear processing unit 101, the nonlinear processing unit 102, the summing unit 103, the comparison unit 104, and the training unit 105 described above is computer equipment including a computation circuit and storage devices, for example, a CPU (Central Processing Unit) 201, a main storage device 202, an external storage device 203 and the like as illustrated in FIG. 3. In the relevant waveform equalization device, the CPU 201 operates by a program expanded in the main storage device 202, and thereby the aforementioned respective functions are realized. Further, it is also possible to configure the aforementioned waveform equalization device by a programmable logic device such as an ASIC (Application Specific Integrated Circuit), and a FPGA (field-programmable gate array). For example, logic elements of a FPGA are equipped with the linear processing unit 101, the nonlinear processing unit 102, the summing unit 103, the comparison unit 104, and the training unit 105 respectively, and thereby can be caused to function as the waveform equalization device.

Figure 4:
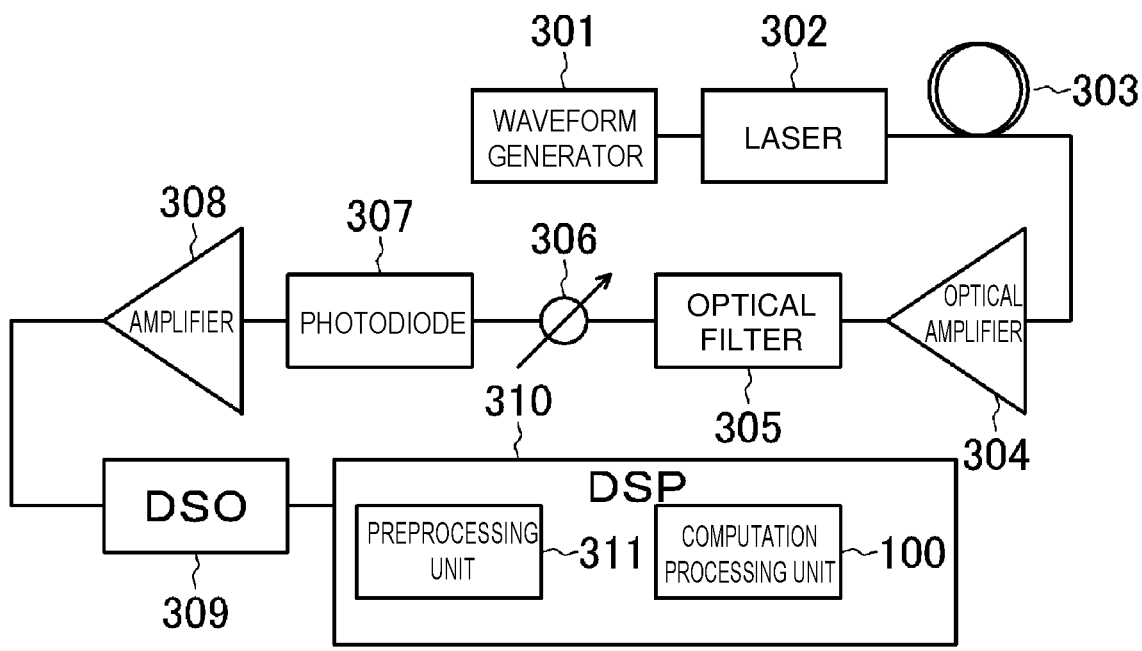
FIG. 4 is a configuration diagram illustrating a configuration in a case where the waveform equalization device according to an embodiment of the present invention is applied to a receiver of optical transmission.

Next, a case where the waveform equalization device in the embodiment of the present invention is applied to a receiver of optical transmission will be described with reference to FIG. 4. First, the receiver includes a waveform generator 301, a laser 302, an optical fiber 303, an erbium doped fiber amplifier (EDFA) 304, an optical filter (OBPF: Optical Band Pass Filter) 305, a variable optical attenuator (VOA) 306, a photodiode 307, an amplifier 308, a digital sampling oscilloscope (DSO) 309, and a waveform equalization device 310.

The laser 302 is an electroabsorption-modulator integrated distributed feedback laser (EML: Elextroabsorption-modulater Integrated Distributed Feedback Laser) that oscillates a laser light of a wavelength 1.55 μm band, for example. The laser 302 is modulation-controlled with an arbitrary signal waveform outputted from the waveform generator 301, and generates a PAM4 signal of 28 GBaud.

The optical fiber 303 is, for example, a single mode optical fiber (SSMF: Standard Single Mode Fiber), and transmits the signal light generated by the laser 302 to the optical amplifier 304. The transmitted signal light is amplified in the optical amplifier 304, and is made a single carrier wave by the optical filter 305. The signal made a single carrier wave is attenuated into a predetermined state in the variable optical attenuator 306, and is photoelectrically converted in the photodiode 307. The signal that is photoelectrically converted in the photodiode 307 is amplified in the amplifier 308, and thereafter passes through the DSO 309 to be inputted to the waveform equalization device 310.

The waveform equalization device 310 is capable of being configured by, for example, a digital signal processor (DSP). In the waveform equalization device 310, preprocessing of removing beat interference between input signals described as follows is performed in a preprocessing unit 311. First, an input signal from the DSO 309 is downsampled by 2SpS (samples-per-symbol), resampling from 80-Sa/s to 56-GSa/s is performed, and synchronization processing (Time Sync.) is performed. After resampling, signal-signal beat interference (SSBI) is removed as necessary. After the aforementioned preprocessing is performed, processing of waveform equalization described by using FIG. 2A, FIG. 2B and FIG. 2C is carried out in the computation processing unit 100.

Figure 5:
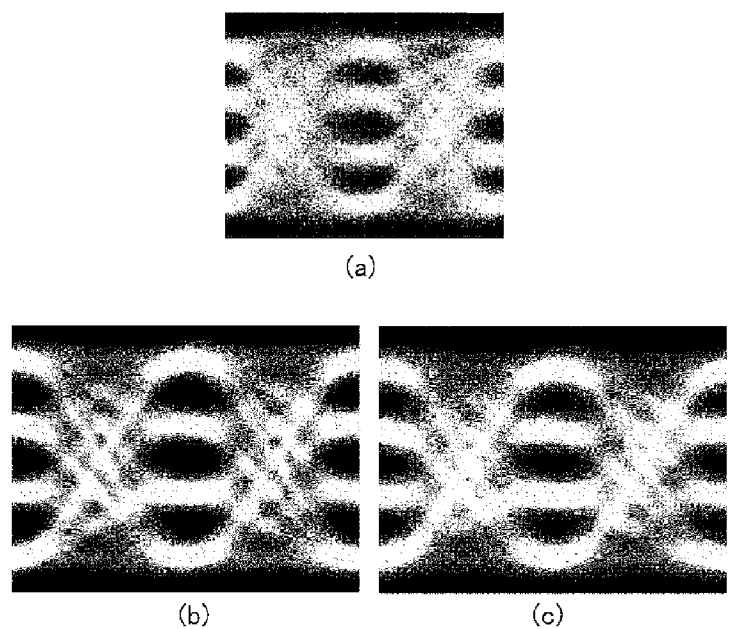
FIG. 5 is a characteristic diagram illustrating a waveform (a) of a signal light outputted from a laser 302 in FIG. 4, and waveforms (b) and (c) of signals after being subjected to waveform equalization processing.

Hereinafter, a result of actually performing waveform equalization processing will be described. Here, the practitioner sets the memory length $L_1=50$, $L_2=35$ and the kernel length h=9, performed equalization processing by using a least square method in the processing in the training unit, and thereafter measured a bit error rate. First, a waveform (a) of the signal light outputted from the laser 302, and waveforms (b) and (c) after the waveform equalization processing is performed are illustrated in FIG. 5. A case where a transmission length of the optical fiber 303 is 20 km is shown in (b), and a case where the transmission length of the optical fiber 303 is made 80 km is shown in (c). As illustrated in FIG. 5, favorable reception characteristics without waveform distortion was confirmed by performing the waveform equalization processing of embodiments of the present invention.

Figure 6:
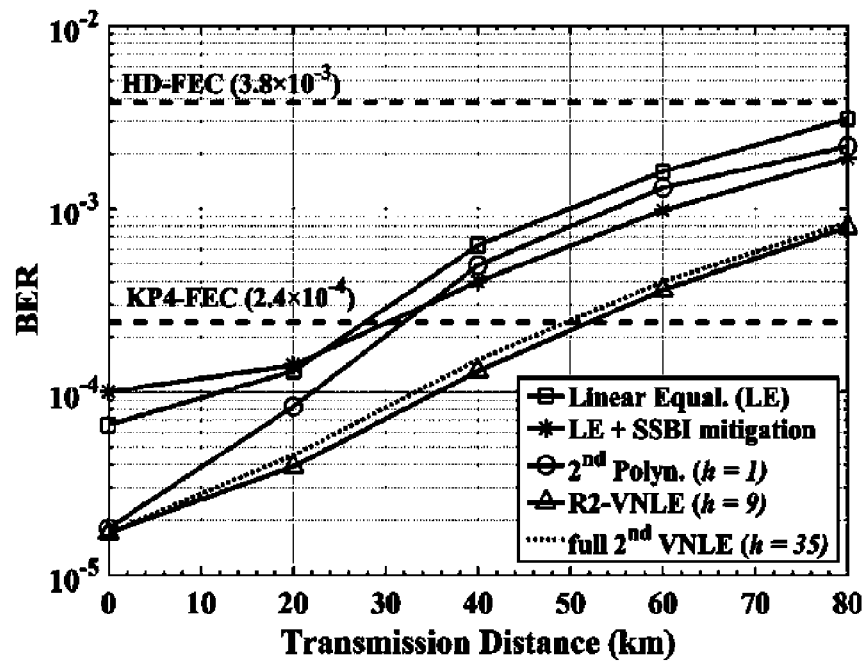
FIG. 6 is a characteristic diagram illustrating a measurement result of a bit error rate (BEL) in equalization processing in transmission distances (Transmission Distance) of 0 to 80 km.
Figure 7:
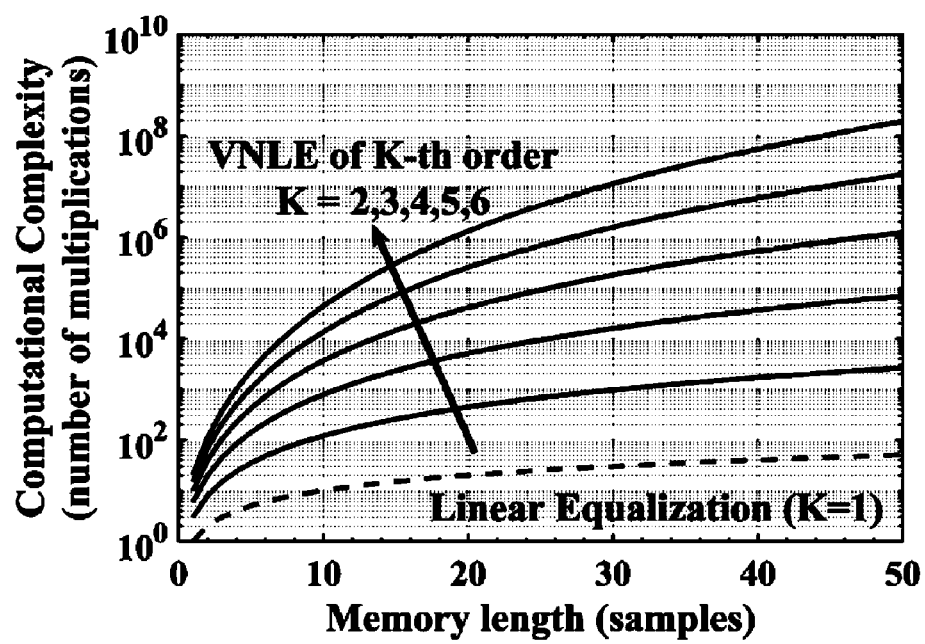
FIG. 7 is an explanatory diagram illustrating a relationship of a memory length $L_k$, an order K of a series, and computational complexity by formula (2).

Next, a measurement result of bit error rates (BEL) in transmission distances (Transmission Distances) of 0 to 80 km is illustrated in FIG. 6. FIG. 6 also illustrates results of the linear equalization (LE), and the cases of h=1, 9 according to embodiments of the present invention and h=35 in formulas (6) and (7) equivalent to the conventional method, that is, formula (3) in addition. As illustrated in FIG. 6, the result in h=9 of embodiments of the present invention is improved greatly as compared with the linear equalization (LE). In addition, the bit error rate shows a comparable result to the conventional equalization processing (full 2$^{nd}$ VNLE, h=35). In this way, according to embodiments of the present invention, it is possible to realize a signal processing function comparable to the conventional equalization processing while significantly reducing the computation processing.

In the explanation of the embodiment described above, the case where embodiments of the present invention are applied to signal processing in optical communication is cited as an example, but it is obvious that the application examples of the present invention are not limited to optical communication from a principle of the present invention. Further, the input signal x which is a target of the present invention is not limited to the aforementioned modulation signal (PAM4 signal), but can also be applied to modulation signals with a higher multi-value degree.

As described above, embodiments of the present invention perform waveform equalization by expanding the input signal x with a second-order Volterra series by using formula (6), in order to obtain the output signal y. Therefore, the present invention can simplify the equalization processing of the signal in which nonlinearity exists.

Note that the present invention is not limited to the embodiment described above, and it is obvious that a number of modifications and combinations can be carried out within the technological idea of the present invention by a person having normal knowledge in the field.

REFERENCE SIGNS LIST

100 Computation processing unit
101 Linear processing unit
101a Delay processing unit
101b Summing unit
102 Nonlinear processing unit
102a Delay processing unit
102b Integration unit
102c Summing unit
103 Summing unit
104 Comparison unit
105 Training unit.

The invention claimed is:

1. A waveform equalization device configured to obtain a waveform-equalize output signal y by expanding an input signal x with a second-order Volterra series, wherein the input signal x is an optical waveform that is input into the waveform equalization device from an optical fiber, the waveform equalization device comprising:
a first processor configured to perform waveform shaping on the input signal x to obtain an m$^{th}$ output signal y(m) according to formula (A) as follows:

$$y(m) = w_1^T \cdot x_{1,m} + \sum_{n=0}^{h-1} w_{2,n}^T \cdot (x_{2,m} \bullet x_{2,m-n}) \quad \text{[Formula (A)]}$$

where, h is a total number of kernels to consider, $1 \leq h \leq L_2$, and $L_2$ is a second-order memory length;

$x_{k,m}$ is a vector notation of an input signal x(m) of k-th order to an m$^{th}$ equalized output signal y(m), and $x_{k,m}=[x(m), x(m-1), \ldots, x(m-L_k+1)]^T$;
$w_1$ is a vector notation of a tap weight of a linear term in the formula (A), $w_1=[w(0), w(1), \ldots, w(L_1+1)]^T$, and $L_1$ is a first-order memory length; and
$w_{2,n}$ is a vector notation of a tap weight of a nonlinear term in the formula (A) to an n$^{th}$ kernel, $W_{2,n}=[W_2(n, 0), w_2(1+n,1), \ldots, w_2(L_2+n-1, L_2-1))]^T$, and $L_2$ is a second-order memory length.

2. The waveform equalization device according to claim 1, further comprising: a second processor configured to remove beat interference between input signals, wherein the input signals comprise the input signal x.

3. The waveform equalization device according to claim 1, wherein the first processor is further configured to output the m$^{th}$ output signal y(m) to another device.

4. The waveform equalization device according to claim 1, wherein the first processor is further configured to:
compare the m$^{th}$ output signal y(m) to a reference signal d(m) to obtain an error signal; and
adjusting the tap weight $w_1$ and the tap weight $w_{2,n}$ based on the error signal.

5. A method comprising:
obtaining, by a processor, an input signal x transmitted from an optical fiber, wherein the input signal x is an optical waveform;
performing, by the processor, waveform shaping on the input signal x to obtain a waveform-equalize output signal y by expanding the input signal x with a second-order Volterra series, wherein an m$^{th}$ output signal y(m) is obtained according to formula (A) as follows:

$$y(m) = w_1^T \cdot x_{1,m} + \sum_{n=0}^{h-1} w_{2,n}^T \cdot (x_{2,m} \bullet x_{2,m-n}) \quad \text{[Formula (A)]}$$

where, h is a total number of kernels to consider, $1 \leq h \leq L_2$, and $L_2$ is a second-order memory length;

$x_{k,m}$ is a vector notation of an input signal x(m) of k-th order to an m$^{th}$ equalized output signal y(m), and $x_{k,m}=[x(m), x(m-1), \ldots, x(m-L_k+1)]^T$;
$w_1$ is a vector notation of a tap weight of a linear term in the formula (A), $w_1=[w(0), w(1), \ldots, w(L_1+1)]^T$, and $L_1$ is a first-order memory length; and
$w_{2,n}$ is a vector notation of a tap weight of a nonlinear term in the formula (A) to an n$^{th}$ kernel, $W_{2,n}=[W_2(n, 0), w_2(1+n,1), \ldots, w_2(L_2+n-1, L_2-1))]^T$, and $L_2$ is a second-order memory length.

6. The method according to claim 5, further comprising removing beat interference between input signals, wherein the input signals comprise the input signal x.

7. The method according to claim 5 further comprising outputting the m$^{th}$ output signal y(m) to another device.

8. The method according to claim 5 further comprising:
comparing, by the processor, the m$^{th}$ output signal y(m) to a reference signal d(m) to obtain an error signal; and
adjusting, by the processor, the tap weight $w_1$, and the tap weight $w_{2,n}$ based on the error signal.

* * * * *